(12) United States Patent
Ueda et al.

(10) Patent No.: US 11,946,606 B2
(45) Date of Patent: Apr. 2, 2024

(54) WAVELENGTH CONVERSION MEMBER, LIGHT SOURCE DEVICE USING SAME, PROJECTOR AND VEHICLE

(71) Applicant: Panasonic Intellectual Property Management Co., Ltd., Osaka (JP)

(72) Inventors: Yuki Ueda, Osaka (JP); Masayuki Hogiri, Osaka (JP); Yoshihisa Nagasaki, Osaka (JP); Kojiro Okuyama, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 604 days.

(21) Appl. No.: 17/273,604

(22) PCT Filed: Jul. 5, 2019

(86) PCT No.: PCT/JP2019/026870
§ 371 (c)(1),
(2) Date: Mar. 4, 2021

(87) PCT Pub. No.: WO2020/054192
PCT Pub. Date: Mar. 19, 2020

(65) Prior Publication Data
US 2021/0270428 A1 Sep. 2, 2021

(30) Foreign Application Priority Data
Sep. 12, 2018 (JP) ................. 2018-170422

(51) Int. Cl.
*F21K 9/64* (2016.01)
*F21S 41/125* (2018.01)

(52) U.S. Cl.
CPC .............. *F21K 9/64* (2016.08); *F21S 41/125* (2018.01)

(58) Field of Classification Search
CPC ......... F21K 9/64; F21S 41/176; F21S 41/125; F21V 9/30
See application file for complete search history.

(56) References Cited

U.S. PATENT DOCUMENTS

| | | | |
|---|---|---|---|
| 5,998,925 A | 12/1999 | Shimizu et al. | |
| 2014/0071683 A1 | 3/2014 | Hamada et al. | |

(Continued)

FOREIGN PATENT DOCUMENTS

| | | |
|---|---|---|
| CN | 107305921 A | 10/2017 |
| JP | 10-242513 | 9/1998 |

(Continued)

OTHER PUBLICATIONS

International Search Report (ISR) from International Searching Authority (Japan Patent Office) in International Pat. Appl. No. PCT/JP2019/026870, dated Oct. 1, 2019.

(Continued)

*Primary Examiner* — William J Carter
(74) *Attorney, Agent, or Firm* — Greenblum & Bernstein, P.L.C.

(57) ABSTRACT

Provided is a wavelength conversion member capable of improving brightness of a light source device. Wavelength conversion member according to the present disclosure includes: first phosphor layer that is disposed on an incidence side where excitation light enters, and contains a plurality of first phosphor particles; and second phosphor layer that is disposed on a side reverse to the incidence side and contains a plurality of second phosphor particles. First phosphor particles include an activation component, second phosphor particles include an activation component same as or different from the activation component included in first phosphor particles, and a concentration of the activation component in first phosphor layer is lower than a concen- (Continued)

tration of the activation component in second phosphor layer.

15 Claims, 13 Drawing Sheets

(56) References Cited

U.S. PATENT DOCUMENTS

| | | | |
|---|---|---|---|
| 2017/0023188 A1* | 1/2017 | Mima | C09K 11/7706 |
| 2017/0067603 A1 | 3/2017 | Tang et al. | |
| 2017/0307163 A1 | 10/2017 | Nagasaki et al. | |

FOREIGN PATENT DOCUMENTS

| | | |
|---|---|---|
| JP | 2927279 | 7/1999 |
| JP | 2016-018878 | 2/2016 |
| JP | 2017-027019 | 2/2017 |
| JP | 2017-049586 | 3/2017 |
| JP | 2017-198982 | 11/2017 |
| KR | 2016-0079375 | 7/2016 |
| WO | 2013/172025 | 11/2013 |

OTHER PUBLICATIONS

Hamilton et al., "Optical-absorption and photoionization measurements from the excited states of $Ce^{3+}$: $Y_3Al_5O_{12}$", Phys. Rev. B 39, pp. 8807 (May 1989).

A. Lenef, et al., "Radiance limits of ceramic phosphors under high excitation fluxes," SPIE 8841, Current Developments in Lens Design and Optical Engineering XIV, 884107, doi: 10.1117/12.2023498 (Sep. 25, 2013).

Chinese Search Report dated Apr. 26, 2022 for the related Chinese Patent Application No. 201980057813.5.

* cited by examiner

US 11,946,606 B2

WAVELENGTH CONVERSION MEMBER, LIGHT SOURCE DEVICE USING SAME, PROJECTOR AND VEHICLE

FIELD OF THE INVENTION

The present disclosure relates to a wavelength conversion member and a light source device using the same.

DESCRIPTION OF THE RELATED ART

A light source device using a light emitter and a wavelength conversion member is known. The wavelength conversion member has phosphor particles embedded in a matrix. The phosphor particles are illuminated with light from the light emitter as excitation light, and light having a wavelength longer than the wavelength of the excitation light is radiated from a phosphor. Attempts have been made to increase the brightness and output of light in this type of light source device.

PTL 1 discloses a light emitting diode (LED) that includes: an LED chip; and a photoluminescent phosphor that absorbs light from the LED chip and emits light. The LED chip is composed of a nitride compound semiconductor. The photoluminescent phosphor is a cerium-activated yttrium aluminum garnet phosphor.

CITATION LIST

Patent Literature

PTL 1: Japanese Patent No. 2927279
PTL 2: International Publication No. 2013/172025

Non-Patent Literature

NPL 1: D. S. Hamilton, et Al., "Optical-absorption and photoionization measurements from the excited states of Ce3+: Y3Al5O12", Phys. Rev. B39, 8807 (1989)
NPL 2: A. Lenef, et. al., SPIE, 2013 doi: 10.1117/12.2023498

SUMMARY OF THE INVENTION

In recent years, it has been required to further improve the brightness of a light source device using a wavelength conversion member.

A wavelength conversion member according to an aspect of the present disclosure includes a first phosphor layer and a second phosphor layer. The first phosphor layer is disposed on an incidence side where excitation light enters, and includes a plurality of first phosphor particles. The second phosphor layer is disposed on a side reverse to the incidence side where the excitation light enters, and includes a plurality of second phosphor particles. The plurality of first phosphor particles is embedded in a first matrix having a refractive index different from a refractive index of the first phosphor particles. Alternatively, the plurality of second phosphor particles is embedded in a second matrix having a refractive index different from a refractive index of the second phosphor particles. The first phosphor particles include an activation component. The second phosphor particles include an activation component that is the same as or different from the activation component included in the first phosphor particles. A concentration of the activation component in the first phosphor layer is lower than a concentration of the activation component in the second phosphor layer.

According to the wavelength conversion member of the present disclosure, the brightness of a light source device can be improved.

DETAILED DESCRIPTION OF THE PREFERRED EMBODIMENTS (Findings which are a Basis of the Present Disclosure)

In a light source device using a wavelength conversion member, an output of an excitation light source is increasing. According to the finding of the inventors of the present invention, the following phenomenon occurs with an increase in output of the excitation light source.

Figure 18:
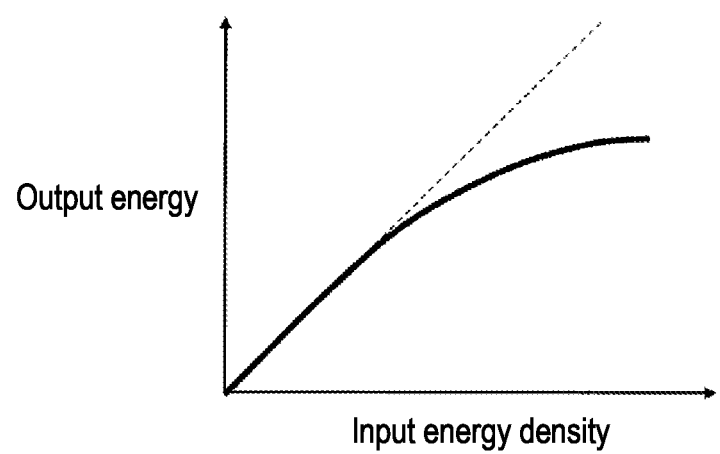
FIG. 18 is a graph showing input/output characteristics of a wavelength conversion member.

FIG. 18 is a graph showing input/output characteristics of a wavelength conversion member. When input energy density of the excitation light is sufficiently high, energy (W) of light output from the wavelength conversion member is not proportional to the input energy density (W/mm$^2$) of the excitation light, and an increase rate of output energy to an increase rate of input energy density decreases. The greater the input energy density of the excitation light is, the more remarkable the decrease in efficiency is. This phenomenon is sometimes called brightness saturation.

Conventionally, it has been considered that the brightness saturation is caused by an increase in temperature of phosphor particles. However, according to the earnest studies of the inventors of the present invention, brightness saturation may occur even if the temperature rise of phosphor particles is sufficiently suppressed. It is considered that there are other causes of the brightness saturation in addition to the temperature of phosphor particles.

The following phenomena can be considered as the causes other than the temperature of phosphor particles. That is, excitation light and converted light are multiply reflected inside the phosphor particles, and multiple excitation from an excited state occurs with high probability, so that internal quantum efficiency is significantly reduced. The wording "multiple excitation from an excited state" means a phenomenon in which an electron excited by excitation light absorbs the excitation light or converted light that is fluorescent light, and is further excited to a non-emission level. With an increase in probability of an occurrence of multiple excitation from the excited state, the internal quantum efficiency decreases.

The inventors of the present invention have made analysis of the wavelength conversion member in order to find a new technique for suppressing a decrease in efficiency due to the brightness saturation. Specifically, the inventors of the present invention have checked the light density distribution of excitation light and converted light in the wavelength conversion member by computer simulation. As a result, the inventors of the present invention have found that the light density is particularly high in the portion near a light receiving surface, so that multiple excitation from the excited state occurs with a high probability, and the efficiency is greatly reduced. Then, the inventors of the present invention have repeatedly carried out simulation on the assumption that reducing imbalance of the light density is effective in suppressing the brightness saturation, and completed the wavelength conversion member according to the present disclosure.

(Summary of One Aspect According to the Present Disclosure)

A wavelength conversion member according to a first aspect of the present disclosure includes a first phosphor layer and a second phosphor layer. The first phosphor layer is disposed on an incidence side of the wavelength conversion member, the first phosphor layer includes a light receiving surface where the excitation light enters, the first phosphor layer contains a plurality of first phosphor particles and a first matrix. The second phosphor layer is disposed on a surface of the first phosphor layer opposite to the light receiving surface where the excitation light enters, the second phosphor layer contains a plurality of second phosphor particles and a second matrix. The plurality of first phosphor particles is embedded in the first matrix having a refractive index different from a refractive index of the first phosphor particles. Alternatively, the plurality of second phosphor particles is embedded in the second matrix having a refractive index different from a refractive index of the second phosphor particles. The first phosphor particles each include an activation component. The second phosphor particles each include an activation component that is the same as or different from the activation component included in each of the first phosphor particles. A concentration of the activation components in the first phosphor particles in the first phosphor layer is lower than a concentration of the activation component in the second phosphor layer.

By using the wavelength conversion member according to the first aspect of the present disclosure, a light source device with high brightness and high efficiency can be obtained.

According to a second aspect of the present disclosure, for example, in the wavelength conversion member according to the first aspect, an amount of absorption of the excitation light per unit volume in the first phosphor layer may be greater than an amount of absorption of the excitation light per unit volume in the second phosphor layer. With this configuration, a light source device with high brightness and high efficiency can be easily obtained.

According to a third aspect of the present disclosure, for example, in the wavelength conversion member according to the first or second aspect, each of the activation components in the first phosphor particles and the activation components in the second phosphor particles may be Ce. When Ce which has a short fluorescence life is used as the activation component, the probability of radiative transition from an excited state to a ground state increases, and the probability of multiple excitation from the excited state can be reduced.

According to a fourth aspect of the present disclosure, for example, in the wavelength conversion member according to the first or second aspect, the first phosphor particles may include a phosphor represented by $Y_{3-x1-y1}R_{y1}Ce_{x1}Al_{5-z1}Ga_{z1}O_{12}$ (where R contains at least one selected from the group consisting of Gd and Tb, x1 satisfies 0.003≤x1≤0.036, y1 satisfies 0≤y1≤2.1, and z1 satisfies 0≤z1≤2.2). Further, the second phosphor particles may include a phosphor represented by $Y_{3-x2-y2}R_{y2}Ce_{x2}Al_{5-z2}Ga_{z2}O_{12}$ (where R includes at least one selected from the group consisting of Gd and Tb, x2 satisfies 0.045≤x2≤0.15, y2 satisfies 0≤y2≤2.1, and z2 satisfies 0≤z2≤2.2). Each of the activation component in the first phosphor particles and the activation component in the second phosphor particles may be Ce. When the first phosphor particles and the second phosphor particles are made of phosphors having the abovementioned compositions, internal quantum efficiency does not easily decrease even if light density of the excitation light is increased, so that a light source device having high brightness and high efficiency is easy to be obtained.

According to a fifth aspect of the present disclosure, for example, in the wavelength conversion member according to any one of the first to fourth aspects, the first phosphor layer may have the first matrix in which the plurality of first phosphor particles is embedded. The second phosphor layer may have the second matrix in which the plurality of second phosphor particles is embedded. With this configuration, travel of light in the first phosphor layer is suppressed, and light extraction efficiency is easily increased.

According to a sixth aspect of the present disclosure, for example, in the wavelength conversion member according to the fifth aspect, the first matrix may be made of ZnO. When ZnO is used as the material of the first matrix, heat of the first phosphor layer can be easily released to the outside.

According to a seventh aspect of the present disclosure, for example, in the wavelength conversion member according to the fifth or sixth aspect, the second matrix may be made of ZnO. When ZnO is used as the material of the second matrix, heat of the second phosphor layer can be easily released to the outside.

According to an eighth aspect of the present disclosure, for example, in the wavelength conversion member according to any one of the fifth to seventh aspects, the second phosphor layer may further have a plurality of light-reflecting particles embedded in the second matrix. With this configuration, light is less likely to travel inside the second phosphor layer.

According to a ninth aspect of the present disclosure, for example, the wavelength conversion member according to any one of the first to eighth aspects may further include a substrate that supports the first phosphor layer and the second phosphor layer, and the second phosphor layer may be located between the first phosphor layer and the substrate. The wavelength conversion member having the configuration described above is suitable for a reflective light source device.

According to a tenth aspect of the present disclosure, for example, the wavelength conversion member according to any one of the first to eighth aspects may further include a substrate that supports the first phosphor layer and the second phosphor layer. The first phosphor layer may be located between the second phosphor layer and the substrate. The wavelength conversion member having the configuration described above is suitable for a transmission light source device.

A light source device according to an eleventh aspect of the present disclosure includes: an excitation light source that emits excitation light having an energy density of 10 W/mm$^2$ or more; and the wavelength conversion member according to any one of the first to tenth aspects that receives the excitation light from the excitation light source and radiates fluorescent light.

According to the light source device of the present disclosure, light having high brightness can be efficiently obtained.

According to a twelfth aspect of the present disclosure, for example, in the light source device according to the eleventh aspect, a peak wavelength of the excitation light may be within a range from 360 nm to 480 nm inclusive. A peak wavelength of a spectrum of the fluorescent light may be within a range from 548 nm to 580 nm inclusive. With this configuration, white light is easy to be obtained.

According to a thirteenth aspect of the present disclosure, for example, in the light source device according to the eleventh or twelfth aspect, a spot diameter of the excitation light entering the wavelength conversion member may be within a range from 10 μm to 10 mm inclusive. When the spot diameter of the excitation light is sufficiently small, it is easy to convert the wavelength-converted light into collimated light with a lens.

A projector according to a fourteenth aspect of the present disclosure includes the light source device according to any one of the eleventh to thirteenth aspects. According to the projector of the present disclosure, light having high brightness can be efficiently obtained.

A vehicle according to a fifteenth aspect of the present disclosure includes the light source device according to any one of the eleventh to thirteenth aspects. According to the vehicle of the present disclosure, light having high brightness can be efficiently obtained.

Exemplary embodiments of the present disclosure will be described below with reference to the drawings. The present disclosure is not limited to the following exemplary embodiments.

Exemplary Embodiments

Figure 1:
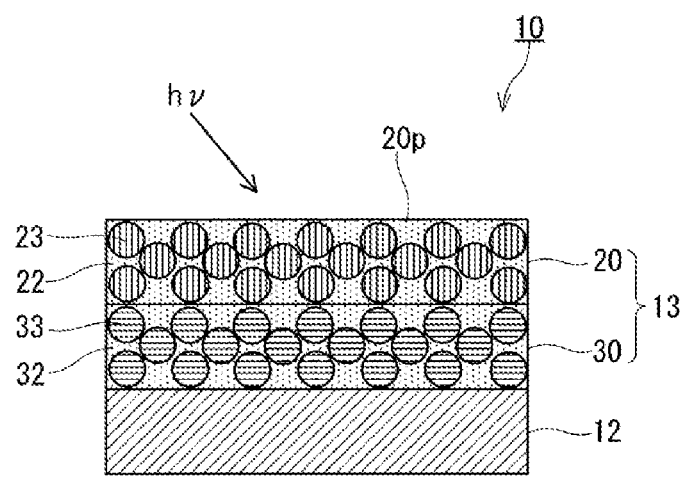
FIG. 1 is a schematic sectional view of a wavelength conversion member according to an exemplary embodiment of the present disclosure.

FIG. 1 schematically shows a cross section of a wavelength conversion member according to an exemplary embodiment of the present disclosure. Wavelength conversion member 10 includes substrate 12 and phosphor layer 13. Substrate 12 supports phosphor layer 13. Phosphor layer 13 has first phosphor layer 20 and second phosphor layer 30. Second phosphor layer 30 is disposed between substrate 12 and first phosphor layer 20. First phosphor layer 20 is in direct contact with second phosphor layer 30. Second phosphor layer 30 is in direct contact with substrate 12. Other layers may be disposed between first phosphor layer 20 and second phosphor layer 30. Other layers may be disposed between substrate 12 and phosphor layer 13. Substrate 12 may be omitted.

Wavelength conversion member 10 according to the present exemplary embodiment is suitable for reflective light source devices. When wavelength conversion member 10 is applied to reflective light source devices, substrate 12 may have a function of reflecting excitation light and converted light.

First phosphor layer 20 is disposed on an incidence side where excitation light enters. Second phosphor layer 30 is disposed on the side reverse to the incidence side. First phosphor layer 20 has light receiving surface 20$p$ on which excitation light is incident. Second phosphor layer 30 is disposed on the reverse side of light receiving surface 20$p$ of first phosphor layer 20. Excitation light is emitted toward light receiving surface 20$p$. Excitation light enters first phosphor layer 20 before entering second phosphor layer 30. Light receiving surface 20$p$ may be the outermost surface of wavelength conversion member 10.

First phosphor layer 20 has first matrix 22 and a plurality of first phosphor particles 23. First matrix 22 exists between first phosphor particles 23. First phosphor particles 23 are embedded in first matrix 22. In other words, first phosphor particles 23 are dispersed in first matrix 22. With this configuration, travel of light in first phosphor layer 20 is suppressed, and light extraction efficiency is easily increased.

Second phosphor layer 30 has second matrix 32 and a plurality of second phosphor particles 33. Second matrix 32 exists between second phosphor particles 33. Second phosphor particles 33 are embedded in second matrix 32. In other words, second phosphor particles 33 are dispersed in second matrix 32. With this configuration, travel of light in second phosphor layer 30 is suppressed, and light extraction efficiency is easily increased.

The thickness of first phosphor layer 20 may be the same as or different from the thickness of second phosphor layer 30. In one example, the thickness of first phosphor layer 20 and the thickness of second phosphor layer 30 are within a range from 1 μm to 1,000 μm.

When illuminated with excitation light having a first wavelength band, wavelength conversion member 10 converts a part of the excitation light into light having a second wavelength band and radiates the converted light. Wavelength conversion member 10 radiates light having a wavelength longer than the wavelength of the excitation light. The second wavelength band is a band different from the first wavelength band. However, a part of the second wavelength band may overlap with the first wavelength band. The light radiated from wavelength conversion member 10 may include not only the fluorescent light radiated from first phosphor particles 23 and second phosphor particles 33 but also the excitation light itself.

Substrate 12 enhances the rigidity of wavelength conversion member 10 and facilitates the production of first phosphor layer 20 and second phosphor layer 30.

The material of substrate 12 is not particularly limited. Examples of the material of substrate 12 include metal, oxide, nitride, carbide, glass, and ceramics. Examples of metal include silicon and aluminum. Examples of oxide include sapphire ($Al_2O_3$), zirconia ($ZrO_2$), quartz ($SiO_2$), and zinc oxide (ZnO). Examples of nitride include gallium nitride (GaN) and aluminum nitride (MN). Examples of carbide include silicon carbide (SiC). The material of substrate 12 may be monocrystal, polycrystal, or amorphous. Substrate 12 may be composed of a plurality of materials.

When substrate 12 does not have translucency, wavelength conversion member 10 can be used in a reflective light source device.

Substrate 12 may have a mirror-polished surface. Other layers such as a reflection layer, a stress relaxation layer, and a light scattering layer may be disposed between substrate 12 and phosphor layer 13. Examples of the reflection layer include a silver reflection layer and an aluminum reflection layer. Examples of the light scattering layer include a layer containing filler particles.

The material of first phosphor particles 23 and the material of second phosphor particles 33 are not particularly limited. Various phosphors can be used as the material of first phosphor particles 23 and the material of second phosphor particles 33.

Each of first phosphor particles 23 includes an activation component serving as an emission center. The type of activation component is not limited. Examples of the activation component include elements such as Ce, Pr, Nd, Sm, Eu, Tb, Dy, Ho, Er, Tm, Yb, and Mn. One or a combination of two or more selected from these elements can be used as the activation component.

Ce may be an example of a preferable activation component. When Ce which has a short fluorescence life is used as the activation component, the probability of radiative transition from an excited state to a ground state increases, and the probability of multiple excitation from the excited state can be reduced.

Each of second phosphor particles 33 also includes an activation component that serves as an emission center. The activation component included in second phosphor particle 33 may be the same as or different from the activation component included in first phosphor particle 23. The type of activation component in second phosphor particle 33 is also not limited. Examples of the activation component in second phosphor particle 33 include the above-mentioned elements.

In the present exemplary embodiment, the concentration Nm of the activation component in first phosphor layer 20 is lower than the concentration $N_{D2}$ of the activation component in second phosphor layer 30. With this configuration, the distribution of light density of the excitation light in phosphor layer 13 can be uniformed in the thickness direction of phosphor layer 13. As a result, it is possible to reduce the probability of occurrence of "multiple excitation from the excited state" that occurs during multiple reflection of light beams inside phosphor layer 13. Therefore, even if the light density of the excitation light is increased, the internal quantum efficiency in first phosphor particles 23 and second phosphor particles 33 does not easily decrease. By using wavelength conversion member 10 according to the present exemplary embodiment, a light source device with high brightness and high efficiency can be obtained.

In the present specification, the concentration Nm of the activation component in first phosphor layer 20 can be represented by a number of activation atoms per unit volume. The concentration $N_{D2}$ of the activation component in second phosphor layer 30 can be represented by a number of activation atoms per unit volume.

The concentration Nm of the activation component in first phosphor layer 20 and the concentration $N_{D2}$ of the activation component in second phosphor layer 30 can be obtained by analysis with, for example, the following method. First, a cross section of phosphor layer 13 is observed with a scanning electron microscope (SEM). The obtained SEM image is binarized to calculate a volume filling rate of phosphor particles in a certain region of phosphor layer 13. Elemental analysis of the phosphor particles can be performed by, for example, an electron beam microanalyzer. The composition of the phosphor particles may be an average of the compositions of arbitrary numbers (for example, 10) of the phosphor particles. From the calculation result of the volume filling rate of the phosphor particles and the analysis result of the composition of the phosphor particles, the concentration Nm of the activation component in first phosphor layer 20 and the concentration $N_{D2}$ of the activation component in second phosphor layer 30 can be obtained.

The phosphor constituting first phosphor particles 23 and second phosphor particles 33 may be an yttrium aluminum garnet (YAG) phosphor containing Ce as an activation component. A YAG phosphor containing Ce as an activation component can be excited by blue light and emit yellow or yellow-green light. Examples of other phosphors include lutetium aluminum garnet (LAG, $Lu_3Al_5O_{12}$) phosphor and LSN ($La_3Si_6N_{11}$) phosphor.

The types of phosphors constituting first phosphor particles 23 and second phosphor particles 33 are not particularly limited. This is because the effect of the present disclosure is obtained by the distribution of atoms of the activation component. Phosphors of various emission colors such as cyan, green, orange, and red can be used.

First phosphor particles 23 may be made of, for example, a phosphor represented by $Y_{3-x1-y1}R_{y1}Ce_{x1}Al_{5-z1}Ga_{z1}O_{12}$. In this composition formula, R includes at least one selected from the group consisting of Gd and Tb. x1 satisfies $0.003 \le x1 \le 0.036$. y1 satisfies $0 \le y1 \le 2.1$. z1 satisfies $0 \le z1 \le 2.2$. The phosphor represented by $Y_{3-x1-y1}R_{y1}Ce_{x1}Al_{5-z1}Ga_{z1}O_{12}$ may have a garnet-type crystal structure. The activation component of first phosphor particles 23 may be Ce.

First phosphor particles 23 may include the above phosphor as a main component. The "main component" means a component that is contained most in a weight ratio. First phosphor particles 23 may substantially include of the above phosphor.

As used herein, the wording "substantially include of . . . " means excluding other components that modify the intrinsic characteristics of the mentioned materials.

First phosphor layer 20 may include, as first phosphor particles 23, a plurality of types of phosphor particles having different compositions. The wavelength of excitation light to be applied to first phosphor particles 23 and the wavelength of fluorescent light to be radiated from first phosphor particles 23 are selected according to intended use of wavelength conversion member 10.

Second phosphor particles 33 may be made of, for example, a phosphor represented by $Y_{3-x2-y2}R_{y2}Ce_{y2}Al_{5-z2}Ga_{z2}O_{12}$. In this composition formula, R includes at least one selected from the group consisting of Gd and Tb. The x2 satisfies $0.045 \leq x2 \leq 0.15$. The y2 satisfies $0 \leq y2 \leq 2.1$. The z2 satisfies $0 \leq z2 \leq 2.2$. The phosphor represented by $Y_{3-x2-y2}R_{y2}Ce_{y2}Al_{5-z2}Ga_{z2}O_{12}$ may have a garnet-type crystal structure. The activation component of second phosphor particles 33 may be Ce.

Second phosphor particles 33 may include the above-mentioned phosphor as a main component. Second phosphor particles 33 may substantially consist of the above phosphor.

Second phosphor layer 30 may include, as second phosphor particles 33, a plurality of types of phosphor particles having different compositions. The wavelength of excitation light to be applied to second phosphor particles 33 and the wavelength of fluorescent light to be radiated from second phosphor particles 33 are selected according to intended use of wavelength conversion member 10.

In a case where first phosphor particles 23 and second phosphor particles 33 are made of phosphors having the abovementioned compositions, internal quantum efficiency does not easily decrease even if the light density of the excitation light is increased, so that a light source device having high brightness and high efficiency is easy to be obtained. It is supposed that, due to the abovementioned compositions, probability of occurrence of multiple excitation from the excited state is reduced.

A base material of the phosphor constituting first phosphor particles 23 may be the same as or different from a base material of the phosphor constituting second phosphor particles 33. The wording "the base materials of the phosphors are the same" means that the compositions of the phosphors are the same, assuming that a specific element is not substituted by the activation component. For example, in a phosphor having a composition of $(Y_{1-x1}Ce_{x1})_3Al_5O_{12}$, the base material is $Y_3Al_5O_{12}$.

The average particle diameter of first phosphor particles 23 is, for example, within a range from 0.1 μm to 50 μm inclusive. The average particle diameter of first phosphor particles 23 can be specified by, for example, the following method. First, the cross section of wavelength conversion member 10 is observed with a scanning electron microscope. In the obtained electron microscopic image, the area of specific first phosphor particles 23 is calculated by image processing. The diameter of a circle having the same area as the calculated area is regarded as the diameter of specific first phosphor particles 23. The particle diameters of an arbitrary number (for example, 50) of first phosphor particles 23 are calculated, and the average value of the calculated values is regarded as the average particle diameter of first phosphor particles 23. In the present disclosure, the shape of first phosphor particles 23 is not limited. First phosphor particles 23 may be spherical, flaky, or fibrous in shape. In the present disclosure, the method for measuring the average particle diameter is not limited to the above method.

The above description regarding the average particle diameter also applies to second phosphor particles 33.

The content percentage of first phosphor particles 23 in first phosphor layer 20 is, for example, within a range from 10 vol % to 75 vol %. The content percentage of second phosphor particles 33 in second phosphor layer 30 is, for example, within a range from 10 vol % to 75 vol %. Note that "vol %" means percentage by volume.

The fluorescence life of the phosphor constituting first phosphor particles 23 is, for example, 100 ns or less. When a phosphor having a long fluorescence life is used, a decrease in efficiency due to the brightness saturation can be suppressed. The lower limit value of the fluorescence life is not particularly limited, but may be 0.1 ns, for example. The fluorescence life can be measured by a commercially available fluorescence life measuring device.

The above description regarding the fluorescence life also applies to the phosphor constituting second phosphor particles 33.

First matrix 22 is made of, for example, resin, glass, or another inorganic material. Examples of the resin include a silicone resin. Examples of the other inorganic material include $Al_2O_3$, ZnO, and $SiO_2$. The other inorganic material may be crystalline. First matrix 22 may be transparent to the excitation light and the converted light. First matrix 22 may have a refractive index higher than the refractive index of first phosphor particles 23, or may have a refractive index lower than the refractive index of first phosphor particles 23. From the viewpoint of transparency and thermal conductivity, ZnO is suitable as the material of first matrix 22. ZnO has high thermal conductivity. Therefore, when ZnO is used as the material of first matrix 22, heat of first phosphor layer 20 can be easily released to the outside.

Specifically, ZnO as the material of first matrix 22 is monocrystalline ZnO or c-axis oriented polycrystalline ZnO. ZnO has a wurtzite crystal structure. The wording "c-axis oriented ZnO" refers to ZnO having the c plane parallel to a principal surface of substrate 12. The "principal surface" is the surface having the largest area. The c-plane may also be parallel to light receiving surface 20p.

The c-axis oriented polycrystalline ZnO includes a plurality of columnar crystal grains oriented along the c-axis. In the c-axis oriented polycrystalline ZnO, there are few grain boundaries in the c-axis direction. The columnar crystal grains are oriented in the c-axis, which means that ZnO grows faster in the c-axis direction than in the a-axis direction and that a tall ZnO crystal grain is formed on substrate 12. The c-axis of ZnO crystal grains is parallel to the normal direction of substrate 12. Alternatively, the inclination of the c-axis of ZnO crystal grains with respect to the normal direction of substrate 12 is 4° or less. The wording "the inclination of the c-axis is 4° or less" herein means that the distribution of inclination of the c-axis is 4° or less, and does not necessarily mean that the inclination of the c-axis of all the crystal grains is 4° or less. The "inclination of the c-axis" can be evaluated by full width at half maximum by X-ray rocking curve measurement for the c-axis. Specifically, the full width at half maximum obtained by X-ray rocking curve measurement for the c-axis is 4° or less. PTL 2 discloses in detail a matrix composed of c-axis oriented polycrystalline ZnO.

The thermal conductivity of the material of first matrix 22 may be, for example, 1 W/m·K or more, and preferably 10 W/m·K or more. The upper limit of the thermal conductivity of the material of first matrix 22 is not particularly limited, but may be 2000 W/m·K, for example. The thermal conductivity may be a value at room temperature of 25° C. When a material having high thermal conductivity is used, the heat dissipation performance of wavelength conversion member 10 is improved and the temperature rise is suppressed. As a result, wavelength conversion member 10 having high conversion efficiency can be provided.

The above description regarding first matrix 22 also applies to second matrix 32.

The material constituting first matrix 22 may be different from or the same as the material constituting second matrix 32. In one example, the material of first matrix 22 and the material of second matrix 32 are ZnO.

When the phosphor constituting first phosphor particles 23 has a composition of $Y_{3-x1-y1}R_{y1}Ce_{x1}Al_{5-z1}Ga_{z1}O_{12}$, the thermal conductivity of first phosphor particles 23 is low due to the influence of Gd, Tb, and Ga. In this case, it is recommended to use ZnO as the material of first matrix 22 to improve the heat dissipation performance of first phosphor layer 20. Due to suppressing the temperature rise of first phosphor layer 20, highly efficient wavelength conversion member 10 can be provided.

Similarly, when the phosphor constituting second phosphor particles 33 has a composition of $Y_{3-x2-y2}R_{y2}Ce_{y2}Al_{5-z2}Ga_{z2}O_{12}$, the thermal conductivity of second phosphor particles 33 is low due to the influence of Gd, Tb, and Ga. In this case, it is recommended to use ZnO as the material of second matrix 32 to improve the heat dissipation performance of second phosphor layer 30. Due to suppressing the temperature rise of second phosphor layer 30, highly efficient wavelength conversion member 10 can be provided.

In general, when phosphor particles are dispersed in a matrix composed of a resin material having thermal conductivity of less than 1 W/m·K, a problem of heat loss due to the temperature rise of the phosphor layer is likely to become apparent.

On the other hand, when the matrix is made of an inorganic material having sufficiently high thermal conductivity, the temperature rise of the phosphor layer can be suppressed. For example, since ZnO has thermal conductivity of about 10 W/m·K, it is possible to effectively suppress the temperature rise of the phosphor layer. The ZnO matrix can sufficiently dissipate heat to the outside even if the input energy density of excitation light is 10 W/mm$^2$ or more. Therefore, when ZnO is used for the matrix of the wavelength conversion member, brightness saturation independent of temperature rise can be found.

First matrix 22 may have a refractive index different from the refractive index of first phosphor particles 23. Second matrix 32 may have a refractive index different from the refractive index of second phosphor particles 33. With this configuration, multiple reflection and multiple refraction of light are likely to occur. When excitation light enters the phosphor particles many times, the optical path length of the excitation light that travels inside the phosphor particles can be extended. Further, since the light emission position is not far from the position where the excitation light enters, a point light source is easily achieved. For example, YAG (refractive index n=1.77) can be used as a material of first phosphor particles 23 and second phosphor particles 33. For example, ZnO (refractive index n=1.95) can be used as the material of first matrix 22 and second matrix 32.

The refractive index can be measured by a critical angle method using the D line (589.3 nm) of sodium. In the present disclosure, a measured refractive index value of a specimen produced using the same material as that of first matrix 22 can be used as the refractive index of first matrix 22. Similarly, a measured refractive index value of a specimen produced using the same material as that of first phosphor particles 23 can be used as the refractive index of first phosphor particles 23. The same also applies to second matrix 32 and second phosphor particles 33. The refractive index generally decreases with an increase in temperature. However, the degree of decrease in refractive index due to an increase in temperature is small. Thus, as long as the requirements described in the present specification are satisfied at room temperature (20° C.), the desired effect can be obtained sufficiently also at a temperature reached in actual use of wavelength conversion member 10.

Next, a method for manufacturing wavelength conversion member 10 will be described.

Second phosphor layer 30 and first phosphor layer 20 are formed in this order on substrate 12.

In a case where first matrix 22 and second matrix 32 are made of resin, the following process is performed. First, second phosphor particles 33 are mixed with a solution containing a resin and a solvent to prepare a coating liquid. The coating liquid is applied to substrate 12 so as to form a coating film on substrate 12. The coating film is dried or cured so as to form second phosphor layer 30 on substrate 12. Next, a coating liquid is prepared using first phosphor particles 23 instead of second phosphor particles 33. The coating liquid is applied to second phosphor layer 30 so as to form a coating film on second phosphor layer 30. The coating film is dried or cured. Thus, wavelength conversion member 10 is obtained.

In a case where first matrix 22 and second matrix 32 are made of ZnO, first matrix 22 and second matrix 32 can be formed by, for example, a sol-gel process. First, a sol mixture containing a precursor such as zinc alkoxide and second phosphor particles 33 is prepared. The sol mixture is applied to substrate 12 so as to form a coating film on substrate 12. The coating film is turned into a gel and heated to form second phosphor layer 30 on substrate 12. Next, a sol mixture is prepared using first phosphor particles 23 instead of second phosphor particles 33. The sol mixture is applied to second phosphor layer 30 so as to form a coating film on second phosphor layer 30. The coating film is turned into a gel and heated. Thus, wavelength conversion member 10 is obtained.

In a case where first matrix 22 or second matrix 32 is made of monocrystalline ZnO or c-axis oriented polycrystalline ZnO, first matrix 22 or second matrix 32 can be formed on substrate 12 by a solution-growth method. First, substrate 12 is prepared. Substrate 12 is obtained by forming a crystalline ZnO thin film on a substrate body such as a sapphire plate. As a method for forming the ZnO thin film, a vacuum film formation method such as electron beam deposition, reactive plasma deposition, sputtering, and pulsed laser deposition is used. The ZnO thin film may be a monocrystalline ZnO thin film or a polycrystalline ZnO thin film. Next, a layer containing second phosphor particles 33 is formed on substrate 12. For example, a dispersion liquid containing second phosphor particles 33 is prepared. Substrate 12 is placed in the dispersion liquid, and second phosphor particles 33 are deposited on substrate 12 using an electrophoretic method. Thus, a layer containing second phosphor particles 33 can be formed on substrate 12. The layer containing second phosphor particles 33 can also be formed on substrate 12 by placing substrate 12 in the dispersion liquid and causing sedimentation of second phosphor particles 33. The layer containing second phosphor particles 33 can also be formed on substrate 12 using a coating liquid containing second phosphor particles 33 by a film formation method such as a printing.

Next, second matrix 32 is formed between the particles by a solution-growth method using a solution containing Zn. Thus, second phosphor layer 30 can be formed on substrate 12. Examples of the solution-growth method include chemical bath deposition performed under atmospheric pressure, hydrothermal synthesis performed under a pressure equal to or higher than atmospheric pressure, or electrochemical deposition in which voltage or current is applied. As the solution for crystal growth, an aqueous zinc nitrate solution containing hexamethylenetetramine is used, for example. Crystalline second matrix 32 is epitaxially grown on the ZnO thin film.

The same process as described above is repeated using first phosphor particles 23 instead of second phosphor particles 33. As a result, first phosphor layer 20 is formed on second phosphor layer 30, and thus, wavelength conversion member 10 is obtained.

Next, wavelength conversion members according to some modifications will be described. The elements common between the exemplary embodiment described with reference to FIG. 1 and modifications are denoted by the same reference signs, and the description of such elements may be omitted. That is, the descriptions regarding the exemplary embodiment and the modifications are mutually applicable, in so far as they are technically consistent with one another.

Further, the exemplary embodiment and the modifications may be combined with one another, in so far as they are technically consistent with one another.

(First Modification)

Figure 2:
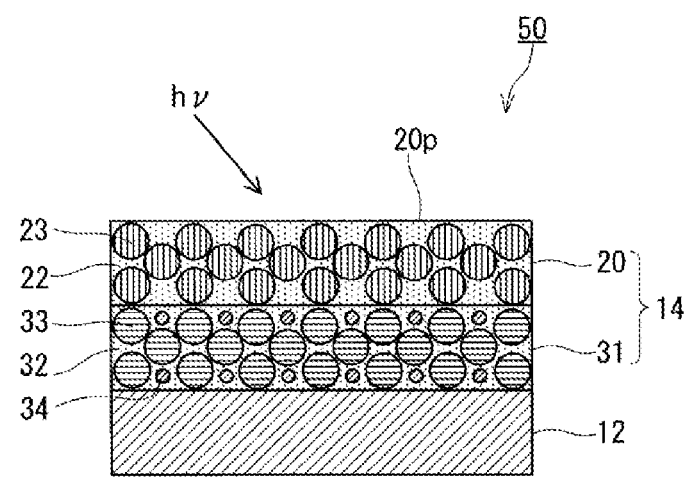
FIG. 2 is a schematic sectional view of a wavelength conversion member according to a first modification.

FIG. 2 schematically shows a cross section of a wavelength conversion member according to a first modification. Wavelength conversion member 50 includes substrate 12 and phosphor layer 14. Substrate 12 supports phosphor layer 14. Phosphor layer 14 has first phosphor layer 20 and second phosphor layer 31. Second phosphor layer 31 further includes a plurality of filler particles 34 in addition to second phosphor particles 33 and second matrix 32. Filler particles 34 are embedded in second matrix 32.

Filler particles 34 are light-reflecting particles and scatter excitation light and converted light. Therefore, light is less likely to travel inside second phosphor layer 31. Due to scattering light positively in second phosphor layer 31 having low light density of the excitation light, the probability of absorption of the excitation light by second phosphor particles 33 is increased, while reducing multiple excitation. As a result, a light source device with high efficiency, high output, and high brightness can be obtained.

Filler particles 34 are, for example, inorganic particles, and typically include a metal oxide. Filler particles 34 may consist substantially of a metal oxide. Most metal oxides are chemically stable and radiate little fluorescent light, and thus are suitable as a material for filler particles 34.

When illuminated with the excitation light, filler particles 34 do not radiate fluorescent light or radiate only fluorescent light having negligible intensity. In one example, filler particles 34 include at least one selected from $SiO_2$ particles and $TiO_2$ particles. These particles meet the above requirements, are chemically stable, and are inexpensive. Filler particles 34 are also not limited in shape. Filler particles 34 may be spherical, flaky, or fibrous in shape.

Filler particles 34 may be included in first phosphor layer 20.

(Second Modification)

Figure 3:
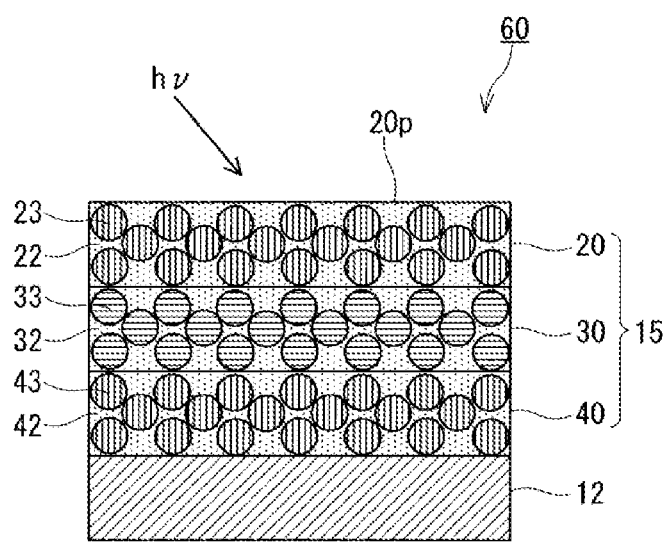
FIG. 3 is a schematic sectional view of a wavelength conversion member according to a second modification.

FIG. 3 schematically shows a cross section of a wavelength conversion member according to a second modification. Wavelength conversion member 60 includes substrate 12 and phosphor layer 15. Phosphor layer 15 has third phosphor layer 40 in addition to first phosphor layer 20 and second phosphor layer 30 described with reference to FIG. 1. Third phosphor layer 40 is located between substrate 12 and second phosphor layer 30.

Third phosphor layer 40 has third matrix 42 and a plurality of third phosphor particles 43. Third matrix 42 exists between third phosphor particles 43. Third phosphor particles 43 are embedded in third matrix 42. In other words, third phosphor particles 43 are dispersed in third matrix 42.

The description regarding the configuration of first phosphor layer 20 can be applied to third phosphor layer 40.

In this modification, the concentration of the activation component in first phosphor layer 20 is lower than the concentration of the activation component in second phosphor layer 30, and the concentration of the activation component in second phosphor layer 30 is lower than the concentration of the activation component in third phosphor layer 40. That is, a number of phosphor layers having different concentrations of activation components is not limited to two. The concentration of the activation component may change continuously along the thickness direction of wavelength conversion member 60.

(Third Modification)

Figure 4:
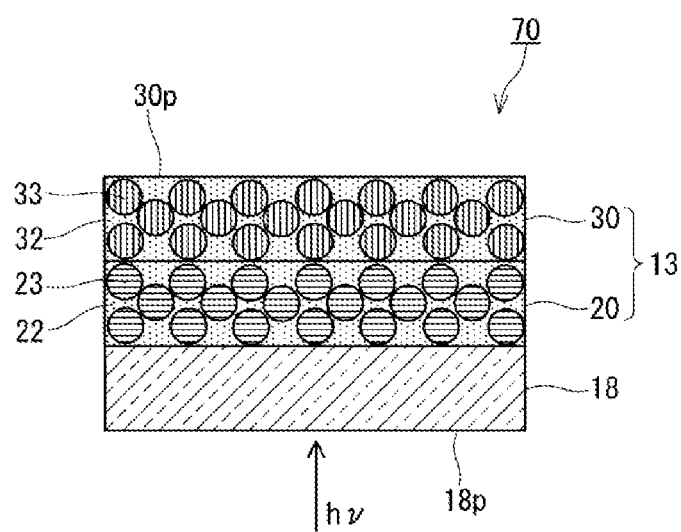
FIG. 4 is a schematic sectional view of a wavelength conversion member according to a third modification.

FIG. 4 schematically shows a cross section of a wavelength conversion member according to a third modification. Wavelength conversion member 70 includes substrate 18 and phosphor layer 13. Substrate 18 supports phosphor layer 13. Phosphor layer 13 has first phosphor layer 20 and second phosphor layer 30. First phosphor layer 20 is disposed between substrate 18 and second phosphor layer 30. Second phosphor layer 30 is in direct contact with first phosphor layer 20. First phosphor layer 20 is in direct contact with substrate 18.

The positional relationship among substrate 18, first phosphor layer 20, and second phosphor layer 30 in wavelength conversion member 70 according to the present modification is different from the positional relationship among substrate 12, first phosphor layer 20, and second phosphor layer 30 in wavelength conversion member 10 described with reference to FIG. 1. In wavelength conversion member 70, first phosphor layer 20 is disposed between substrate 18 and second phosphor layer 30. In wavelength conversion member 10, second phosphor layer 30 is disposed between substrate 12 and first phosphor layer 20.

In wavelength conversion member 70, substrate 18 has translucency with respect to excitation light and converted light. In this case, wavelength conversion member 70 is suitable for a transmission light source device. Substrate 18 has light receiving surface 18p that is not in contact with phosphor layer 13. Light receiving surface 18p may be the back surface of substrate 18. Excitation light enters substrate 18 through light receiving surface 18p, and first phosphor layer 20 and second phosphor layer 30 are illuminated with the excitation light transmitted through substrate 18 in this order. Second phosphor layer 30 has emission surface 30p located on the side reverse to the incidence side where excitation light enters. Emission surface 30p may be the upper surface of second phosphor layer 30. Converted light is radiated to the outside of wavelength conversion member 70 mainly through emission surface 30p. A dichroic mirror that transmits excitation light and reflects converted light may be provided between substrate 18 and phosphor layer 13.

Wavelength conversion member 70 is obtained by forming first phosphor layer 20 and second phosphor layer 30 on substrate 18 in this order.

(Exemplary Embodiment of Light Source Device)

Figure 5:
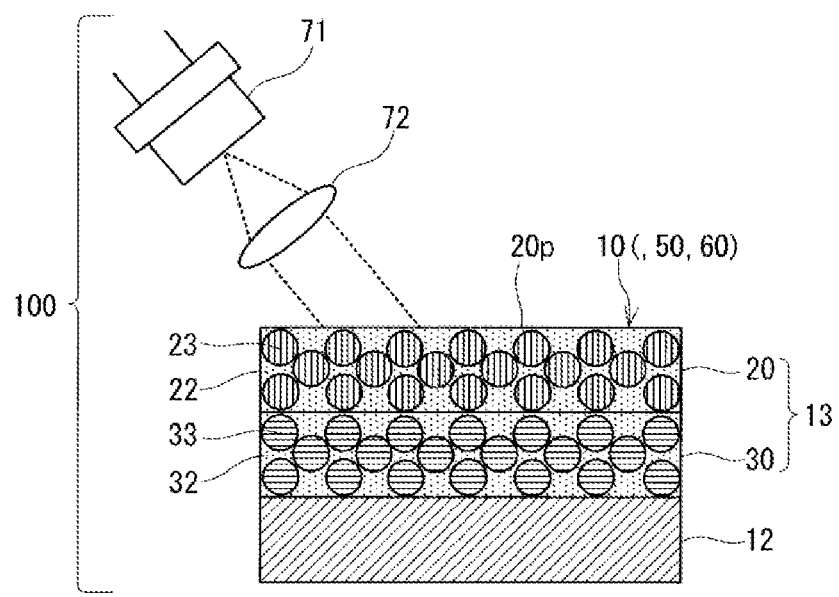
FIG. 5 is a schematic sectional view of a light source device using the wavelength conversion member according to the present disclosure.

FIG. 5 schematically shows a cross section of a light source device using the wavelength conversion member according to the present disclosure. Light source device 100 includes wavelength conversion member 10 and excitation light source 71. First phosphor layer 20 of wavelength conversion member 10 is located between excitation light source 71 and substrate 12 of wavelength conversion member 10. Excitation light is emitted from excitation light source 71 toward light receiving surface 20p of first phosphor layer 20. The excitation light reaches first phosphor layer 20 and second phosphor layer 30 in this order. That is, light source device 100 is a reflective light source device. Wavelength conversion members 50 and 60 can also be used instead of wavelength conversion member 10. A combination of two or more of wavelength conversion members 10, 50, and 60 can also be used in light source device 100. Excitation light reflected by a mirror may be radiated to light receiving surface 20p. Therefore, the position of excitation light source 71 is not limited to the position shown in FIG. 5.

Excitation light source 71 emits excitation light having energy density of 10 W/mm$^2$ or more, for example. The wavelength conversion member according to the present disclosure is particularly useful for a light source device that uses excitation light having high energy density. The upper limit of the input energy density of the excitation light is not particularly limited, but may be, for example, 1,000 W/mm$^2$.

The "energy density" means a value obtained by dividing the irradiation energy of the excitation light applied to a specific range by the area of the range. The energy density can be measured, for example, by the following method. An object is illuminated with excitation light. A range in which the irradiation intensity of the excitation light is 1/e$^2$ or more of the peak intensity (where e is the base of natural logarithm, and e=2.718 . . . ) is specified. The irradiation energy of the excitation light applied to the specified range is measured. The area of the specified range is calculated. The energy density is determined by dividing the irradiation energy of the excitation light by the area of the specified range.

Excitation light source 71 is typically a semiconductor light emitter. The semiconductor light emitter is, for example, an LED, a superluminescent diode (SLD), or a laser diode (LD). Excitation light source 71 may be composed of a single LD, or may be composed of a plurality of LDs optically coupled to each other.

The peak wavelength of the excitation light is, for example, within a range from 360 nm to 480 nm inclusive. The peak wavelength of the spectrum of fluorescent light is, for example, within a range from 548 nm to 580 nm inclusive. Purple to blue excitation light is converted into green to yellow light by wavelength conversion member 10. With this configuration, white light is easy to be obtained.

The spot diameter of excitation light entering wavelength conversion member 10 is, for example, within a range from 10 μm to 10 mm inclusive. When the spot diameter of the excitation light is sufficiently small, it is easy to convert the wavelength-converted light into collimated light with a lens. Note that the spot diameter of the excitation light that enters wavelength conversion member 10 indicates the spot diameter of the excitation light on the front surface of wavelength conversion member 10 when the excitation light enters wavelength conversion member 10.

The spot diameter means the diameter of a circle having the same area as the area of a range where the irradiation intensity of the excitation light is 1/e$^2$ or more of the peak intensity. The smaller the spot diameter of the excitation light, the easier the light radiated from phosphor layer 13 can be condensed. That is, light radiated from phosphor layer 13 can be efficiently used. However, the smaller the spot diameter of the excitation light, the higher the energy density of the excitation light. When the spot diameter of the excitation light is within the above range, light having high brightness can be efficiently obtained.

Light source device 100 further includes optical system 72. Optical system 72 may be located on an optical path of the excitation light radiated from excitation light source 71. Optical system 72 includes optical components such as a lens, a mirror, and an optical fiber.

Figure 6:
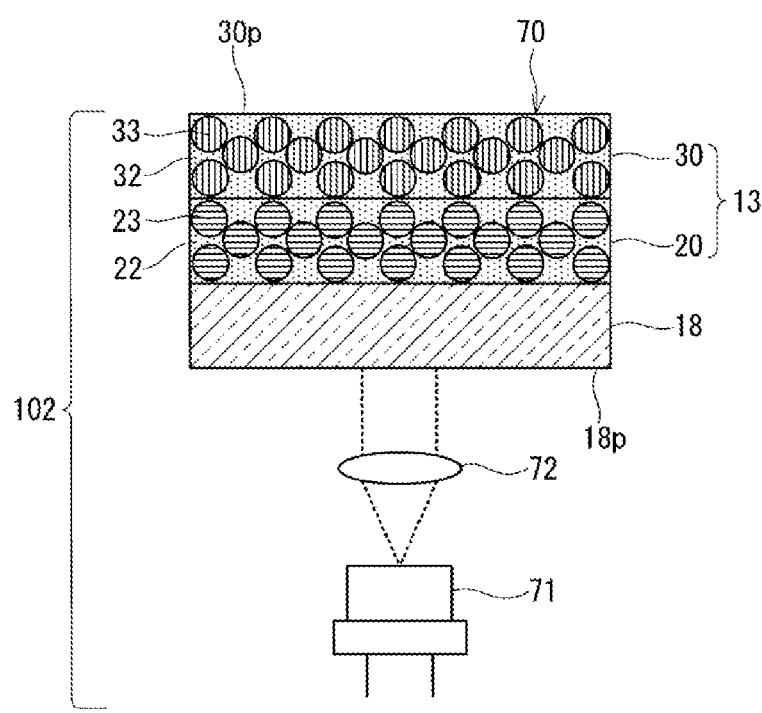
FIG. 6 is a schematic sectional view of another light source device using the wavelength conversion member according to the present disclosure.

FIG. 6 schematically shows a cross section of another light source device using the wavelength conversion member according to the present disclosure. Light source device 102 includes wavelength conversion member 70 and excitation light source 71. Excitation light source 71 faces substrate 18 of wavelength conversion member 70. Excitation light passes through substrate 18 and reaches first phosphor layer 20 and second phosphor layer 30 in this order. That is, light source device 102 is a transmission light source device.

(Exemplary Embodiment of Illumination Device)

Figure 7:
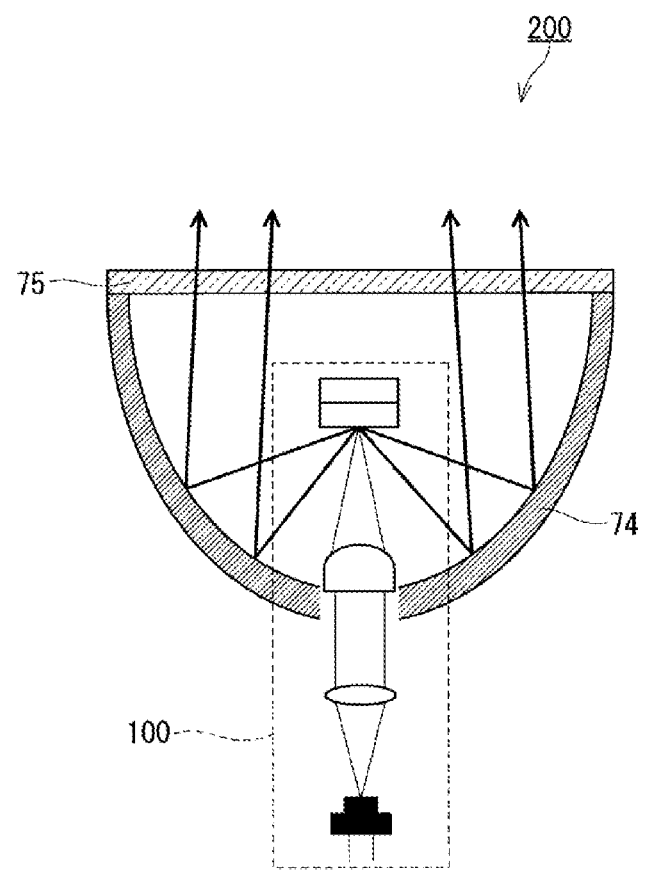
FIG. 7 is a schematic diagram showing a configuration of an illumination device using the light source device shown in FIG. 5.

FIG. 7 schematically shows a configuration of an illumination device using the light source device shown in FIG. 5. Illumination device 200 includes light source device 100 and optical component 74. Optical component 74 is a component for guiding light radiated from light source device 100 forward, and is specifically a reflector. Optical component 74 has, for example, a metal film made of Al, Ag, or the like, or an Al film having a protective film formed on its surface. Filter 75 may be provided in front of light source device 100. Filter 75 absorbs or scatters blue light such that coherent blue light from the light emitter of light source device 100 does not go outside directly. Illumination device 200 may be of a so-called reflector type or of a projector type. Illumination device 200 is, for example, a vehicle headlamp.

Figure 8:
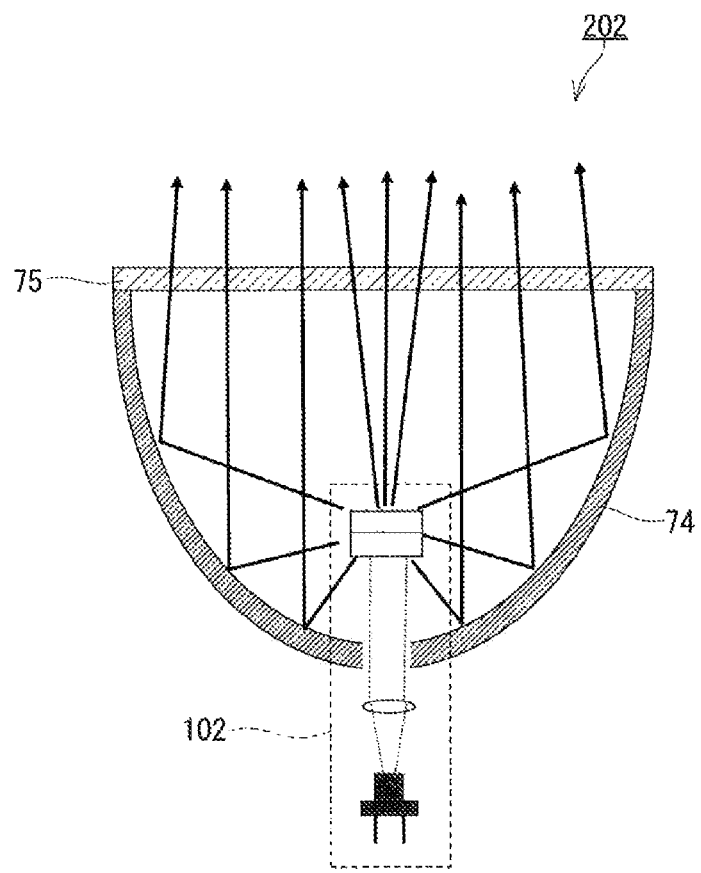
FIG. 8 is a schematic diagram showing a configuration of an illumination device using the light source device shown in FIG. 6.

FIG. 8 schematically shows a configuration of an illumination device using the light source device shown in FIG. 6. Illumination device 202 can be configured using light source device 102 that is a reflective light source device.

(Exemplary Embodiment of Vehicle)

Figure 9:
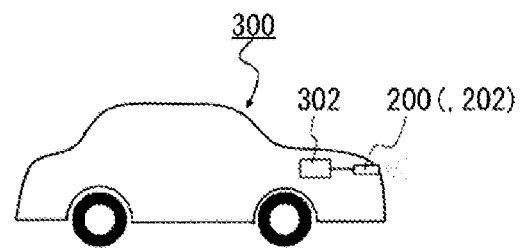
FIG. 9 is a schematic diagram showing a configuration of a vehicle using the illumination device according to the present disclosure.

FIG. 9 schematically shows a configuration of a vehicle using the illumination device according to the present disclosure. Vehicle 300 includes illumination device 200 (or 202) as a vehicle headlamp and power supply source 302. Illumination device 200 and power supply source 302 are provided in the front part of vehicle 300. Power supply source 302 is electrically connected to illumination device 200. Power supply source 302 has, for example, an electric circuit and a generator that is rotationally driven by a drive source such as an engine to generate electric power. The electric circuit includes, for example, a battery or a capacitor.

According to light source device 100, light having high brightness can be efficiently obtained. Therefore, illumination device 200 of vehicle 300 can efficiently emit light having high brightness. Light radiated from illumination device 200 can easily illuminate an object existing at a position away from illumination device 200. The power consumption of illumination device 200 is lower than that of a conventional headlamp.

(Modification of Light Source Device)

Figure 10:
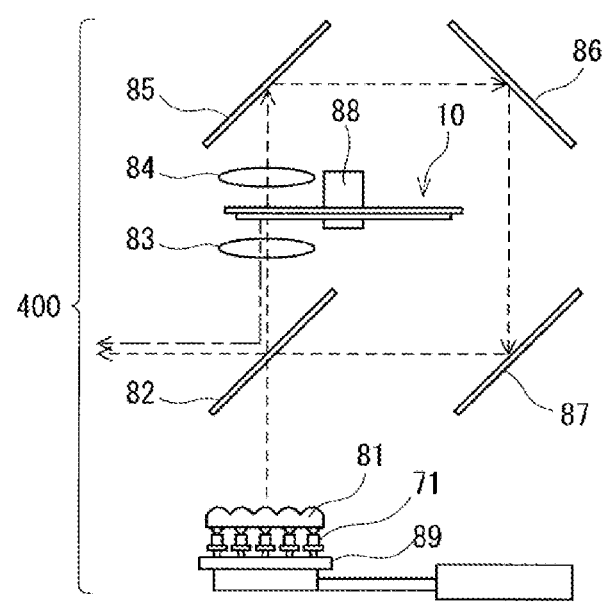
FIG. 10 is a schematic diagram showing a configuration of another light source device using the wavelength conversion member according to the present disclosure.

FIG. 10 schematically shows the configuration of another light source device using the wavelength conversion member according to the present disclosure. Light source device 400 includes wavelength conversion member 10 and a plurality of excitation light sources 71. Phosphor layer 13 of wavelength conversion member 10 is located between the plurality of excitation light sources 71 and substrate 12 of wavelength conversion member 10. The plurality of excitation light sources 71 faces phosphor layer 13 of wavelength conversion member 10. Light source device 400 is suitable for use as a projector.

Figure 11:
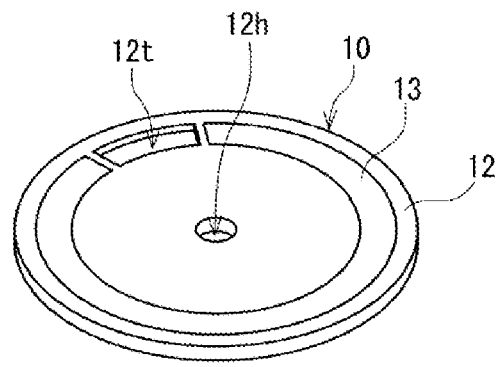
FIG. 11 is a perspective view of the wavelength conversion member included in the light source device shown in FIG. 10.

FIG. 11 is a perspective view of wavelength conversion member 10 included in the light source device shown in FIG. 10. Substrate 12 of wavelength conversion member 10 has a disc shape. Substrate 12 has through hole 12h and translucent part 12t. Through hole 12h extends in the thickness direction of substrate 12. Through hole 12h is located at the center of an imaginary circle defined by the outer peripheral surface of substrate 12, for example. Translucent part 12t has an arc shape. Translucent part 12t may be in contact with phosphor layer 13. Translucent part 12t is, for example, a through hole. Translucent part 12t may be made of a transparent resin or glass. Translucent part 12t may be made of a translucent material such as sapphire or quartz.

Phosphor layer 13 has an arc shape. Phosphor layer 13 and translucent part 12t are arranged along an imaginary circle defined by the outer peripheral surface of phosphor layer 13. Phosphor layer 13 partially covers the main surface of substrate 12.

As shown in FIG. 10, light source device 400 further includes motor 88. Wavelength conversion member 10 is disposed in motor 88. Specifically, a shaft of motor 88 is inserted into through hole 12h of substrate 12. Wavelength conversion member 10 is fixed to motor 88 by a fastening member such as a screw. Wavelength conversion member 10 is rotated by motor 88, and is illuminated with excitation light radiated from the plurality of excitation light sources 71. This makes it possible to prevent phosphor layer 13 from being partially illuminated with the excitation light. Therefore, temperature rise of phosphor layer 13 due to excitation light and fluorescent light can be suppressed.

Light source device 400 further includes collimating lens 81, dichroic mirror 82, lenses 83 and 84, and reflection mirrors 85, 86, and 87. Collimating lens 81, dichroic mirror 82, and lens 83 are located between the plurality of excitation light sources 71 and wavelength conversion member 10. Collimating lens 81, dichroic mirror 82, and lens 83 are arranged in this order on the optical path of excitation light radiated from the plurality of excitation light sources 71. Lens 84, reflection mirror 85, reflection mirror 86, reflection mirror 87, and dichroic mirror 82 are arranged in this order on the optical path of the excitation light transmitted through wavelength conversion member 10.

Collimating lens 81 condenses the excitation light radiated from the plurality of excitation light sources 71. Collimated light can be obtained by collimating lens 81. Dichroic mirror 82 can transmit excitation light, and efficiently reflect light radiated from wavelength conversion member 10. Lens 83 condenses excitation light and light radiated from wavelength conversion member 10. Lens 84 condenses the excitation light that has passed through wavelength conversion member 10. Collimated light can be obtained by lens 84. Each of reflection mirrors 85, 86, and 87 reflects the excitation light.

Light source device 400 further includes heat sink 89. Heat sink 89 is in contact with the plurality of excitation light sources 71. By means of heat sink 89, heat of the plurality of excitation light sources 71 can be easily released to the outside. Thus, temperature rise of the plurality of excitation light sources 71 can be suppressed, whereby a decrease in energy conversion efficiency of the plurality of excitation light sources 71 can be suppressed.

Next, the operation of light source device 400 will be described.

First, the plurality of excitation light sources 71 radiates excitation light. The excitation light is condensed by collimating lens 81 and converted into collimated light. Next, the excitation light passes through dichroic mirror 82 and is further condensed by lens 83. Lens 83 can adjust the spot diameter of the excitation light that is to enter phosphor layer 13. Next, the excitation light enters wavelength conversion member 10. Wavelength conversion member 10 is rotated by motor 88. Therefore, the operation of light source device 400 has a period in which the excitation light enters phosphor layer 13 and a period in which the excitation light passes through translucent part 12t. When the excitation light enters phosphor layer 13, wavelength conversion member 10 radiates light having a wavelength longer than that of the excitation light. The light radiated from wavelength conversion member 10 is condensed by lens 83 and converted into collimated light. The light radiated from wavelength conversion member 10 is reflected by dichroic mirror 82 and sent to the outside of light source device 400.

When passing through translucent part 12t, the excitation light is condensed by lens 84 and converted into collimated light. The excitation light passing through lens 84 is reflected by reflection mirrors 85, 86, and 87. Next, the excitation light passes through dichroic mirror 82. Thus, the excitation light is sent to the outside of light source device 400. At this time, the excitation light mixes with the light radiated from wavelength conversion member 10.

(Exemplary Embodiment of Projector)

Figure 12:
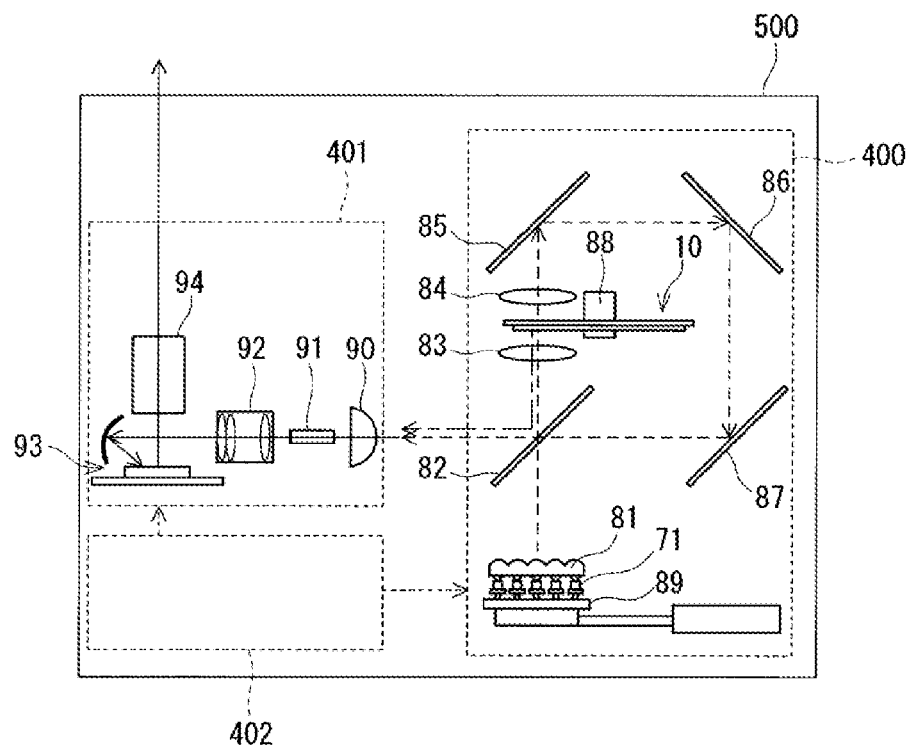
FIG. 12 is a schematic diagram showing a configuration of a projector using the light source device according to the present disclosure.

FIG. 12 schematically shows the configuration of a projector using the light source device according to the present disclosure. Projector 500 includes light source device 400, optical unit 401, and controller 402. Optical unit 401 converts light radiated from light source device 400 and projects an image or video on an object outside projector 500. The object outside projector 500 may be, for example, a screen. Optical unit 401 includes condenser lens 90, rod integrator 91, lens unit 92, display element 93, and projection lens 94.

Condenser lens 90 condenses light radiated from light source device 400. Thus, the light radiated from light source device 400 is condensed on an end surface of rod integrator 91 on an incidence side.

Rod integrator 91 has, for example, a quadrangular prism shape. The light incident on rod integrator 91 is repeatedly totally reflected in rod integrator 91 and is emitted from an end surface of rod integrator 91 on an emission side. The light emitted from rod integrator 91 has a uniform brightness distribution.

Lens unit 92 has a plurality of lenses. Examples of the plurality of lenses included in lens unit 92 include a condenser lens and a relay lens. Lens unit 92 guides the light emitted from rod integrator 91 to display element 93.

Display element 93 converts the light passing through lens unit 92. Thus, an image or video to be projected on an object outside projector 500 can be obtained. Display element 93 is, for example, a digital mirror device (DMD).

Projection lens 94 projects the light converted by display element 93 to the outside of projector 500. As a result, the light converted by display element 93 can be projected onto the object. Projection lens 94 has one or more lenses. Examples of the lens included in projection lens 94 include a biconvex lens and a plano-concave lens.

Controller 402 controls each component of light source device 400 and optical unit 401. Controller 402 is, for example, a microcomputer or a processor.

Figure 13:
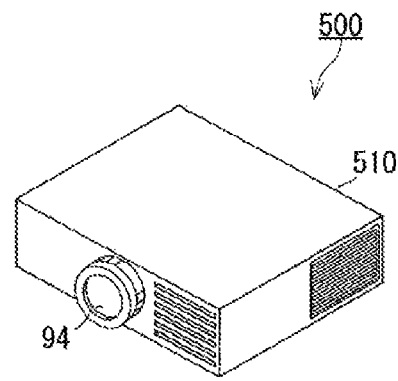
FIG. 13 is a perspective view of the projector shown in FIG. 12.

FIG. 13 is a perspective view of the projector shown in FIG. 12. Projector 500 further includes a housing 510. Housing 510 houses light source device 400, optical unit 401, and controller 402. A part of projection lens 94 of optical unit 401 is exposed to the outside of housing 510.

According to light source device 400, light having high brightness can be efficiently obtained. Therefore, projector 500 can efficiently project light having high brightness. According to light source device 400, a number of excitation light sources to be required can be reduced as compared with a conventional projector. The power consumption of projector 500 is lower than that of a conventional projector. According to light source device 400, the projector can be downsized.

Examples

Internal quantum efficiencies (IQEs) of wavelength conversion members having the following configurations were calculated by computer simulation. Specifically, light density inside phosphor particles was calculated by ray tracing, and internal quantum efficiency was calculated from the light density inside the phosphor particles. More specifically, the light density in the phosphor layer was calculated by the following ray tracing (1), the light density in the phosphor particles was specified from the light density in the phosphor layer, and the internal quantum efficiency was calculated with the method (2) below using the light density in the phosphor particles.

(1) Calculation of Light Density in Phosphor Particles

Figure 14:
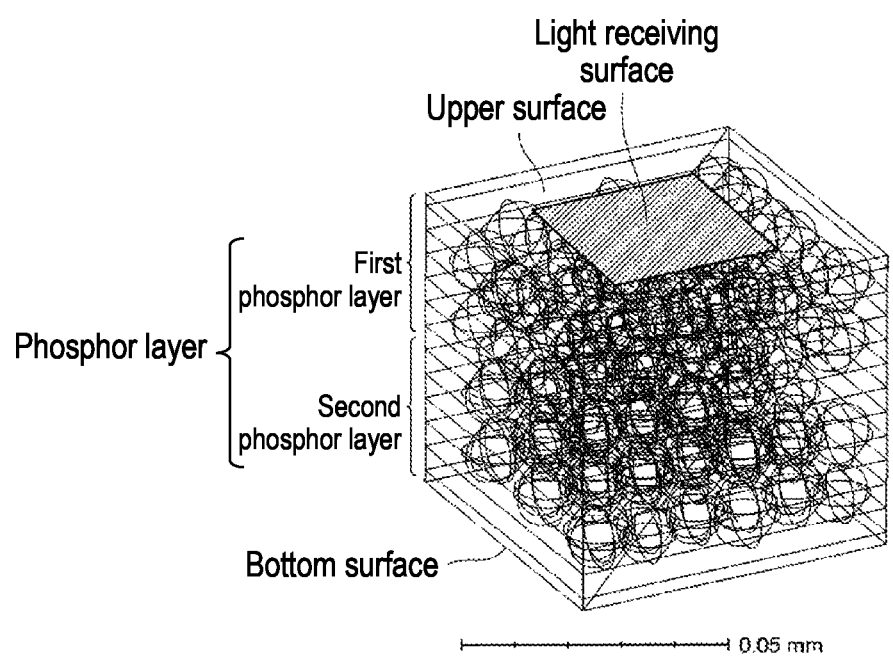
FIG. 14 is a diagram showing a phosphor layer model used for calculation of internal quantum efficiency.

As shown in FIG. 14, a 60 μm-thick rectangular parallelepiped having an upper surface of 64 μm in length and 64 μm in width (64 μm×64 μm) was provided as a model of the phosphor layer. The bottom surface and the side surface of the phosphor layer were mirror surfaces. A light receiving surface of 48 μm in length and 48 μm in width (48 μm×48 μm) was set at a position sharing the center with the upper surface.

The phosphor layer includes a first phosphor layer having a thickness of 30 μm and a second phosphor layer having a thickness of 30 μm. The first phosphor layer includes a light receiving surface. The second phosphor layer includes a bottom surface. Spherical phosphor particles were disposed in the phosphor layer such that the volume filling rate of the phosphor particles in the phosphor layer was 50%. The diameter of each of phosphor particles was 12 μm.

The composition of the first phosphor particles in the first phosphor layer was $(Y_{1-x1}Ce_{x1})_3Al_5O_{12}$. The composition of the second phosphor particles in the second phosphor layer was $(Y_{1-x2}Ce_{x2})_3Al_5O_{12}$. As shown in Tables 1 and 2, in Examples and Comparative Examples, the atomic ratios x1 and x2 of Ce to the total of Y and Ce were set.

The refractive index of the phosphor particles was set to 1.77. The first matrix and the second matrix were transparent resins having a refractive index of 1.42. An absorption coefficient α was calculated from the following equation (1) using the value of absorption cross section and atomic concentration C (%) of the activation component. The absorption coefficient α is the reciprocal of the distance in which the light intensity decays to 1/e. As the absorption cross section, the value described in the paper by D. S. Hamilton et al. (NPL 1) was used.

The atomic concentrations C of the activation components are values obtained by multiplying the value x1 and the value x2 in the compositions of $(Y_{1-x1}Ce_{x1})_3Al_5O_{12}$ and $(Y_{1-x2}Ce_{x2})_3Al_5O_{12}$ by 100.

$$\alpha = 41.67C \ [\text{mm}^{-1}] \quad (1)$$

The simulation conditions were set such that wavelength conversion was performed inside the phosphor particles with the absorption coefficient α and a quantum efficiency of 100%, and the traveling direction of fluorescent light was randomly selected.

An excitation light source having a wavelength of 445 nm was disposed above the phosphor layer, and emitted excitation light with uniform light density (434 W/mm²) of 1 W in total to the phosphor layer. The light densities of excitation light and converted light observed on measurement surfaces were calculated by the ray tracing method. The wavelength of the converted light that was fluorescent light was 550 nm. The light density distribution of the phosphor layer at predetermined incident energy density was calculated from the ratio between the light density of 434 W/mm² and predetermined incident energy density within a range from 0.1 W/mm² to 500 W/mm² inclusive.

The measurement surfaces for light density have a size of 64 μm×64 μm and parallel to the upper surface. The measurement surfaces for light density were set on 12 locations at 2.5 μm, 7.5 μm, 12.5 μm, . . . 57.5 μm from the upper surface to the bottom surface. The resolution on each measurement surface was 100×100, and the light density for each pixel was recorded.

A series of calculations was performed by a commercially available optical simulator (Zemax OpticStudio manufactured by Zemax, LLC, USA).

Figure 15:
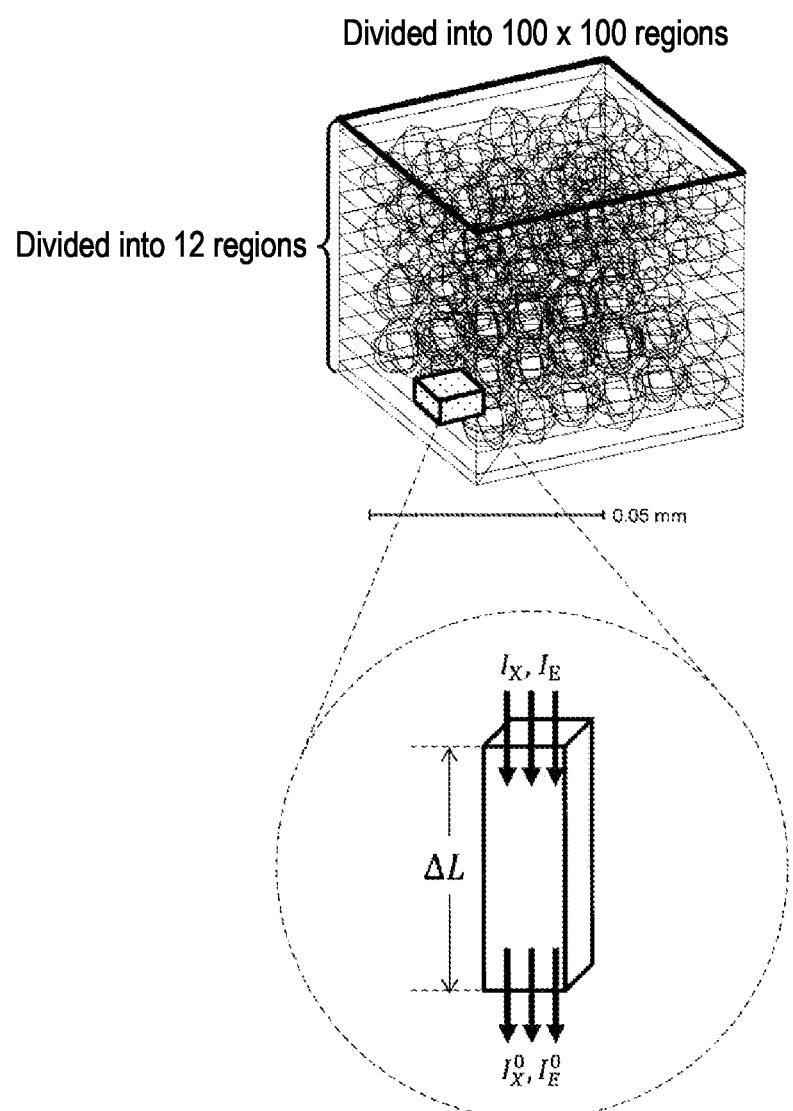
FIG. 15 is another diagram showing a phosphor layer model used for calculation of internal quantum efficiency.

(2) Calculation of Internal Quantum Efficiency IQE from the Light Density Inside the Phosphor Particles Next, as shown in FIG. 15, the phosphor layer was divided into 100 regions vertically and 100 regions horizontally (divided into 100×100 regions) in relation to a direction parallel to the upper surface, and was divided into 12 regions in relation to the thickness direction perpendicular to the front surface. Thus, the phosphor layer was divided into 120,000 regions in total. The light density of each measurement surface and each pixel obtained by ray tracing was assigned to each of the divided regions. In FIG. 15, $I_X$ represents the density of excitation light before wavelength conversion. $I_E$ represents the density of fluorescent light before wavelength conversion. $I_X^0$ represents the density of excitation light after wavelength conversion. $I_E^0$ represents the density of fluorescent light after wavelength conversion.

In each of the divided regions, absorbed photon density and emitted photon density when the above light densities were output were calculated using a steady-state three-level model. The steady-state three-level model is described, for example, in the paper by A. Lenef et al. (NPL 2).

A transition rate at which excitation from the excited state occurs was calculated using the absorption cross section described in the paper by D. S. Hamilton et al. (NPL 1). The fluorescence life τr of the phosphor was 60 ns. The time constant τnr of non-radiative transition of the phosphor was 800 ns. A representative optical path length ΔL of the divided region was set to be equal to the division width (5 μm) in the thickness direction.

In the three-level model, a direct solution may be obtained, or an approximate solution may be obtained using an iterative method.

Finally, the internal quantum efficiency was calculated by substituting the calculation results of the three-level model into an equation for calculating the internal quantum efficiency.

The above calculation was carried out using commercially available mathematical analysis software (Mathematica manufactured by Wolfram Research, USA).

Furthermore, a decrease rate and maintenance rate of the internal quantum efficiency (IQE) when the input energy density Pin was increased stepwise from 0.1 W/mm² to 500 W/mm² were calculated. The decrease rate of the internal quantum efficiency (IQE) is a value calculated by the following equation (2). The maintenance rate of the internal quantum efficiency (IQE) is a value obtained by the following equation (3). An output of the converted light was obtained by the following method. Energy intensities of the converted light in the 120,000 regions when the internal quantum efficiency was calculated were summed up to obtain output intensity of the converted light output from the entire phosphor layer.

Figure 16:
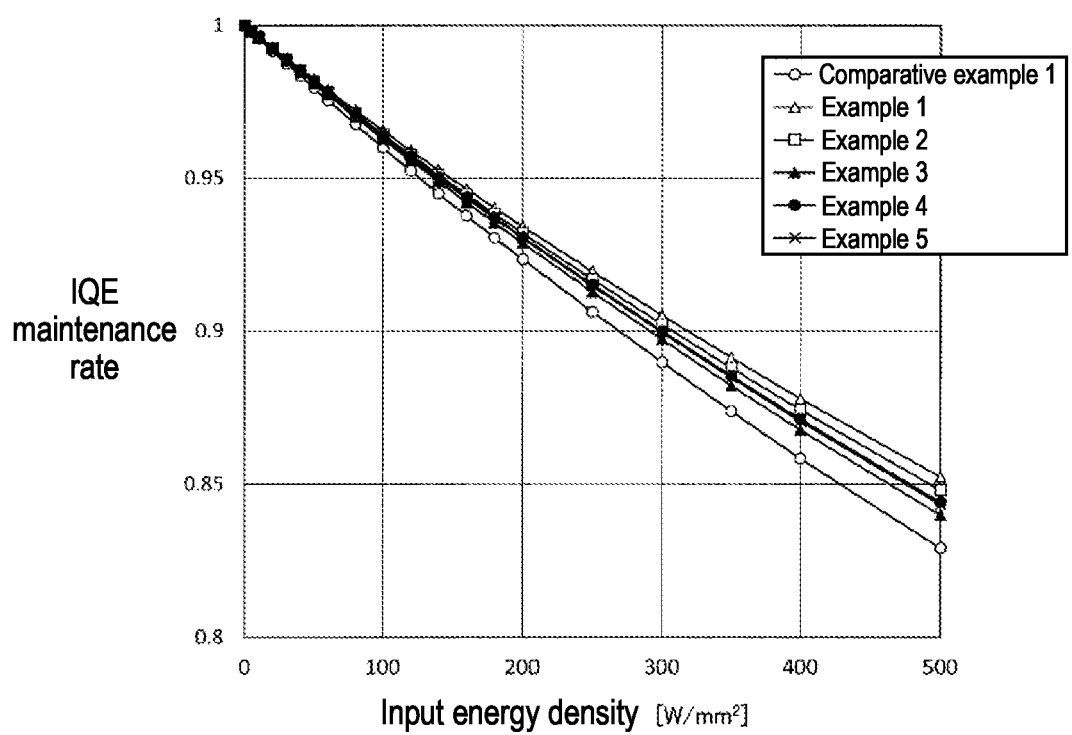
FIG. 16 is a graph showing a relationship between input energy density and a maintenance rate of internal quantum efficiency.

Tables 1 and 2 and FIG. 16 show the results. Table 1 shows the results when the input energy density Pin of the excitation light is 10 W/mm². Table 2 shows the results when the input energy density of the excitation light is 500 W/mm². In the graph of FIG. 16, the horizontal axis represents the input energy density Pin of the excitation light. The vertical axis represents the maintenance rate of the internal quantum efficiency.

Decrease rate of internal quantum efficiency=$(A1-A2)/A1$      (2)

Maintenance rate of internal quantum efficiency=$A2/A1$      (3)

A1: Internal quantum efficiency when the input energy density Pin is 0.1 W/mm²
A2: Internal quantum efficiency at a specific input energy density Pin As shown in Tables 1 and 2, the ratios of the outputs of Examples 1 to 7 and Comparative Examples 2 to 4 to the output of Comparative Example 1 were calculated. The outputs were assessed on the basis of the ratios to the output of Comparative Example 1 according to the following criteria.

(Criteria for Assessment of Output)
∘ (good): 0.98 or more
Δ (average): more than 0.90 and less than 0.98
x (below average): 0.90 or less As shown in Tables 1 and 2, the ratios of the decrease rates of internal quantum efficiency of Examples 1 to 7 and Comparative Examples 2 to 4 to the decrease rate of internal quantum efficiency of Comparative Example 1 were calculated. The efficiencies were assessed on the basis of the

TABLE 1

| | atomic concentration of activation component | | | | | ratio to IQE | | | |
| --- | --- | --- | --- | --- | --- | --- | --- | --- |
| | first phosphor layer 100* × 1 | second phosphor layer 100* × 2 | output (W) | ratio to output of Comparative Example 1 | IQE decrease rate | decrease rate of Comparative Example 1 | assessment of output | assessment of efficiency |
| Comparative Example 1 | 1.5 | 1.5 | 0.0156 | — | 0.418% | — | ∘ | X |
| Comparative Example 2 | 0.5 | 0.5 | 0.0124 | 0.80 | 0.346% | 0.83 | X | ◉ |
| Comparative Example 3 | 1.0 | 1.0 | 0.0148 | 0.95 | 0.375% | 0.90 | Δ | X |
| Comparative Example 4 | 2.0 | 2.0 | 0.0160 | 1.02 | 0.479% | 1.15 | ∘ | X |
| Example 1 | 0.5 | 1.5 | 0.0143 | 0.92 | 0.360% | 0.86 | Δ | ◉ |
| Example 2 | 0.5 | 2.0 | 0.0146 | 0.94 | 0.373% | 0.89 | Δ | ◉ |
| Example 3 | 1.2 | 1.6 | 0.0154 | 0.98 | 0.386% | 0.92 | ∘ | ∘ |
| Example 4 | 1.0 | 2.0 | 0.0153 | 0.98 | 0.375% | 0.90 | ∘ | ∘ |
| Example 5 | 1.0 | 2.4 | 0.0153 | 0.98 | 0.377% | 0.90 | ∘ | ∘ |
| Example 6 | 0.45 | 1.8 | 0.0145 | 0.93 | 0.369% | 0.88 | Δ | ◉ |
| Example 7 | 1.0 | 3.6 | 0.0154 | 0.99 | 0.390% | 0.93 | ∘ | ∘ |

TABLE 2

| | atomic concentration of activation component | | | | | ratio to IQE | | | |
| --- | --- | --- | --- | --- | --- | --- | --- | --- |
| | first phosphor layer 100* × 1 | second phosphor layer 100* × 2 | output (W) | ratio to output of Comparative Example 1 | IQE decrease rate | decrease rate of Comparative Example 1 | assessment of output | assessment of efficiency |
| Comparative Example 1 | 1.5 | 1.5 | 0.644 | — | 17.1% | — | ∘ | X |
| Comparative Example 2 | 0.5 | 0.5 | 0.529 | 0.82 | 14.2% | 0.83 | X | ◉ |
| Comparative Example 3 | 1.0 | 1.0 | 0.622 | 0.97 | 15.5% | 0.91 | Δ | ∘ |
| Comparative Example 4 | 2.0 | 2.0 | 0.646 | 1.00 | 18.9% | 1.11 | ∘ | X |
| Example 1 | 0.5 | 1.5 | 0.606 | 0.94 | 14.8% | 0.86 | Δ | ◉ |
| Example 2 | 0.5 | 2.0 | 0.618 | 0.96 | 15.2% | 0.89 | Δ | ◉ |
| Example 3 | 1.2 | 1.6 | 0.642 | 1.00 | 16.0% | 0.94 | ∘ | ∘ |
| Example 4 | 1.0 | 2.0 | 0.641 | 1.00 | 15.6% | 0.91 | ∘ | ∘ |
| Example 5 | 1.0 | 2.4 | 0.643 | 1.00 | 15.7% | 0.92 | ∘ | ∘ |
| Example 6 | 0.4 | 2.0 | 0.612 | 0.95 | 15.0% | 0.88 | Δ | ◉ |
| Example 7 | 1.5 | 5.0 | 0.644 | 1.00 | 16.1% | 0.94 | ∘ | ∘ | ratios to the decrease rate of internal quantum efficiency of Comparative Example 1 according to the following criteria.

(Criteria for Assessment of Efficiency)
⊚ (excellent): less than 0.90
○ (good): 0.90 or more and less than 0.95
Δ (average): 0.95 or more and less than 1.00
x (below average): 1.00 or more As shown in Tables 1 and 2, the results of assessment of outputs and assessment of efficiencies of the wavelength conversion members of Examples 1 to 7 were all above the average.

The outputs of the wavelength conversion members of Examples 1, 2, and 6 were average, while the efficiencies of the wavelength conversion members of Examples 1, 2, and 6 were particularly excellent. That is, the configurations of the wavelength conversion members of Examples 1, 2, and 6 are particularly useful for applications in which priority is placed on efficiency with the concentration of the activation component being suppressed.

The wavelength conversion member of Comparative Example 2 was also excellent in efficiency, but inferior in output.

The wavelength conversion members of Examples 3, 4, 5, and 7 were good in output and efficiency. That is, the The atomic concentrations of the activation components shown in Tables 1 and 2 are the values obtained by multiplying the values x1 and x2 in compositions of $(Y_{1-x1}Ce_{x1})_3Al_5O_{12}$ and $(Y_{1-x2}Ce_{x2})_3Al_5O_{12}$ by 100. The distribution of the phosphor particles in first phosphor layer 20 is the same as the distribution of the phosphor particles in second phosphor layer 30, and the filling rates of the phosphor particles are also the same. The volume of first phosphor layer 20 is equal to the volume of second phosphor layer 30. Therefore, in Examples 1 to 7, the concentration Nm of the activation component in first phosphor layer 20 is lower than the concentration $N_{D2}$ of the activation component in second phosphor layer 30. In Comparative Examples 1 to 4, the concentration of the activation component is constant in each layer.

Amounts of absorption and absorption densities of the first phosphor layer and the second phosphor layer of the model described with reference to FIG. 14 were also calculated. Table 3 shows the results. The ratio of the absorption density is a ratio of the absorption density of the first phosphor layer to the absorption density of the second phosphor layer.

TABLE 3

| | amount of absorption (W) | | absorption density (W/mm³) | | ratio of absorption density (first/second) |
|---|---|---|---|---|---|
| | first phosphor layer | second phosphor layer | first phosphor layer | second phosphor layer | |
| Comparative Example 1 | 0.80415 | 0.22714 | 6544.2 | 1848.4 | 3.5404 |
| Comparative Example 2 | 0.47765 | 0.34083 | 3887.1 | 2773.7 | 1.4014 |
| Comparative Example 3 | 0.67123 | 0.30676 | 5462.5 | 2496.4 | 2.1882 |
| Comparative Example 4 | 0.89907 | 0.16032 | 7316.7 | 1304.7 | 5.6080 |
| Example 1 | 0.40880 | 0.53563 | 3326.8 | 4358.9 | 0.7632 |
| Example 2 | 0.39901 | 0.56853 | 3247.2 | 4626.7 | 0.7018 |
| Example 3 | 0.71809 | 0.29700 | 5843.8 | 2417.0 | 2.4178 |
| Example 4 | 0.64074 | 0.36774 | 5214.4 | 2992.6 | 1.7424 |
| Example 5 | 0.63744 | 0.37623 | 5187.5 | 3061.7 | 1.6943 |
| Example 6 | 0.37153 | 0.58446 | 3023.5 | 4756.4 | 0.6357 |
| Example 7 | 0.69846 | 0.32227 | 5684.0 | 2622.7 | 2.1673 | configurations of the wavelength conversion members of Examples 3, 4, 5, and 7 are particularly useful for applications in which priority is placed on balance between output and efficiency.

Figure 17:
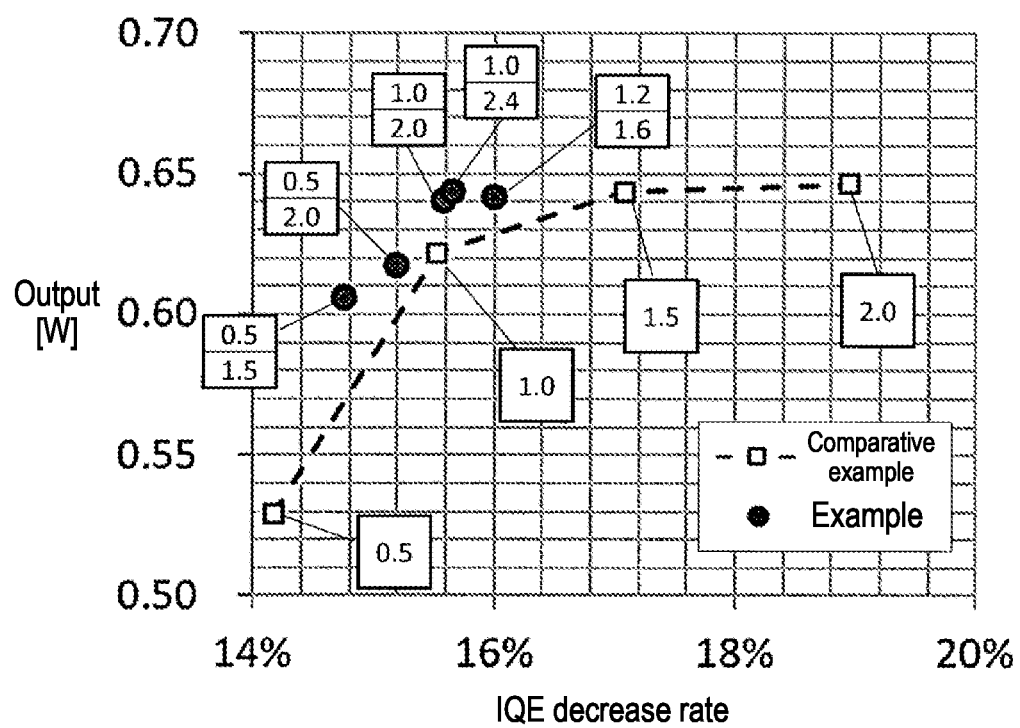
FIG. 17 is a graph showing a relationship between a decrease rate of internal quantum efficiency and an output.

FIG. 17 shows the relationship between the decrease rate of the internal quantum efficiency and the output when the input energy density Pin of the excitation light is 500 W/mm². Square marks represent extracted data of Comparative Examples 1 to 4. Circles represent the data of Examples 1 to 5. Each data is the same as the value in Table 2.

As can be understood from the graph of FIG. 17, the wavelength conversion members of Examples were excellent in balance between the decrease rate of the internal quantum efficiency and the output. It can be considered that the wavelength conversion members of Examples each have both high output and high efficiency.

The internal quantum efficiency was calculated for a model in which the bottom surface of the phosphor layer was a mirror surface as shown in FIG. 14. It is to be noted that the same results as those shown in Tables 1 and 2 can be obtained even when the same calculation is performed with the bottom surface being a transmission surface.

In each of the wavelength conversion members of Examples 3 to 5 and 7, the amount of absorption of excitation light per unit volume in the first phosphor layer was larger than the amounts of absorption of excitation light per unit volume in the second phosphor layer. Such requirements are often satisfied by a wavelength conversion member having an excellent balance between the output and the efficiency.

The light source device including the wavelength conversion member according to the present disclosure can be used for general illumination devices such as ceiling lights. Further, the light source device including the wavelength conversion member according to the present disclosure can be used for special illumination devices such as spotlights, devices for stadium lighting, and devices for studio lighting. In addition, the light source device including the wavelength conversion member according to the present disclosure can be used for illumination devices for vehicle such as headlamps. Further, the light source device including the wavelength conversion member according to the present disclosure can be used for image devices such as projectors, head-up displays, digital cameras, and television receivers.

In addition, the light source device including the wavelength conversion member according to the present disclosure can be used for medical instruments such as endoscopes. The light source device including the wavelength conversion member according to the present disclosure can be used for information devices such as personal computers, tablet personal computers, smartphones, and mobile phones.

The invention claimed is:

1. A wavelength conversion member that emits fluorescent light when illuminated with excitation light, the wavelength conversion member comprising:
    a first phosphor layer disposed on an incidence side of the wavelength conversion member, the first phosphor layer including a light receiving surface where the excitation light enters, the first phosphor layer containing a plurality of first phosphor particles and a first matrix; and
    a second phosphor layer disposed on a surface of the first phosphor layer opposite to the light receiving surface, the second phosphor layer containing a plurality of second phosphor particles and a second matrix, wherein
    the plurality of first phosphor particles is embedded in the first matrix having a refractive index different from a refractive index of the first phosphor particles, or the plurality of second phosphor particles is embedded in the second matrix having a refractive index different from a refractive index of the second phosphor particles,
    the first phosphor particles each include an activation component,
    the second phosphor particles each include an activation component same as or different from the activation component included in each of the first phosphor particles, and
    a concentration of the activation components in the first phosphor particles in the first phosphor layer is lower than a concentration of the activation components in the second phosphor particles in the second phosphor layer.

2. The wavelength conversion member according to claim 1, wherein an amount of absorption of the excitation light per unit volume in the first phosphor layer is greater than an amount of absorption of the excitation light per unit volume in the second phosphor layer.

3. The wavelength conversion member according to claim 1 or 2, wherein each of the activation components in the first phosphor particles and the activation components in the second phosphor particles is Ce.

4. The wavelength conversion member according to claim 1, wherein
    the first phosphor particles include a phosphor represented by $Y_{3-x1-y1}R_{y1}Ce_{x1}Al_{5-z1}Ga_{z1}O_{12}$, where R contains at least one selected from a group consisting of Gd and Tb, x1 satisfies $0.003 \leq x1 \leq 0.036$, y1 satisfies $0 \leq y1 \leq 2.1$, and z1 satisfies $0 \leq z1 \leq 2.2$,
    the second phosphor particles include a phosphor represented by $Y_{3-x2-y2}R_{y2}Ce_{x2}Al_{5-z2}Ga_{z2}O_{12}$, where R includes at least one selected from a group consisting of Gd and Tb, x2 satisfies $0.045 \leq x2 \leq 0.15$, y2 satisfies $0 \leq y2 \leq 2.1$, and z2 satisfies $0 \leq z2 \leq 2.2$, and
    each of the activation components in the first phosphor particles and the activation components in the second phosphor particles is Ce.

5. The wavelength conversion member according to claim 1, wherein
    the plurality of first phosphor particles is embedded in the first matrix, and
    the plurality of second phosphor particles is embedded in the second matrix.

6. The wavelength conversion member according to claim 5, wherein the first matrix is made of ZnO.

7. The wavelength conversion member according to claim 5, wherein the second matrix is made of ZnO.

8. The wavelength conversion member according to claim 5, wherein the second phosphor layer further includes a plurality of light-reflecting particles embedded in the second matrix.

9. The wavelength conversion member according to claim 1, further comprising a substrate that supports the first phosphor layer and the second phosphor layer, wherein the second phosphor layer is located between the first phosphor layer and the substrate.

10. The wavelength conversion member according to claim 1, further comprising a substrate that supports the first phosphor layer and the second phosphor layer,
    wherein the first phosphor layer is located between the second phosphor layer and the substrate.

11. A light source device comprising:
    an excitation light source that emits excitation light having an energy density of 10 W/mm² or more; and
    the wavelength conversion member according to claim 1 that receives the excitation light from the excitation light source and radiates fluorescent light.

12. The light source device according to claim 11, wherein
    a peak wavelength of the excitation light emitted from the excitation light source is within a range from 360 nm to 480 nm inclusive, and
    a peak wavelength of a spectrum of the fluorescent light is within a range from 548 nm to 580 nm inclusive.

13. The light source device according to claim 11, wherein a spot diameter of the excitation light entering the wavelength conversion member is within a range from 10 μm to 10 mm inclusive.

14. A projector comprising the light source device according to claim 11.

15. A vehicle comprising the light source device according to claim 11 as a headlight.

* * * * *